(12) United States Patent
Park et al.

(10) Patent No.: US 8,048,746 B2
(45) Date of Patent: Nov. 1, 2011

(54) METHOD OF MAKING FLASH MEMORY CELLS AND PERIPHERAL CIRCUITS HAVING STI, AND FLASH MEMORY DEVICES AND COMPUTER SYSTEMS HAVING THE SAME

(75) Inventors: Jin-Taek Park, Suwon-si (KR); Young-Woo Park, Seoul (KR); Jang-Hyun You, Seoul (KR); Jung-Dal Choi, Suwon-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/979,890

(22) Filed: Dec. 28, 2010

(65) Prior Publication Data

US 2011/0117713 A1 May 19, 2011

Related U.S. Application Data

(62) Division of application No. 12/367,988, filed on Feb. 9, 2009, now Pat. No. 7,872,295.

(30) Foreign Application Priority Data

Jun. 23, 2008 (KR) .................. 10-2008-0059077

(51) Int. Cl.
*H01L 21/336* (2006.01)
(52) U.S. Cl. ........ 438/287; 438/424; 438/216; 438/257; 257/311; 257/E29.309
(58) Field of Classification Search .................. 438/424, 438/216, 257, 258, 287; 257/311, 314–316, 257/324, E29.309
See application file for complete search history.

(56) References Cited

U.S. PATENT DOCUMENTS
2009/0173989 A1* 7/2009 Yaegashi ...................... 257/320
* cited by examiner

*Primary Examiner* — Zandra Smith
*Assistant Examiner* — Paul Patton
(74) *Attorney, Agent, or Firm* — F. Chau & Associates, LLC

(57) ABSTRACT

An integrated circuit includes flash memory cells, and peripheral circuitry including low voltage transistors (LVT) and high voltage transistors (HVT). The integrated circuit includes a tunnel barrier layer comprising SiON, SiN or other high-k material. The tunnel barrier layer may comprise a part of the gate dielectric of the HVTs. The tunnel barrier layer may constitute the entire gate dielectric of the HVTs. The corresponding tunnel barrier layer may be formed between or upon shallow trench isolation (STIs). Therefore, the manufacturing efficiency of a driver chip IC may be increased.

12 Claims, 16 Drawing Sheets

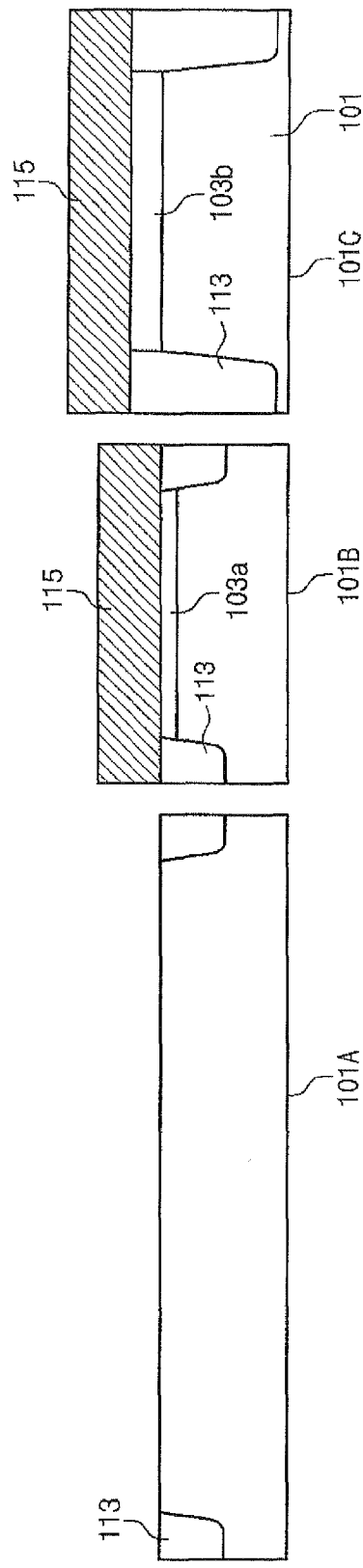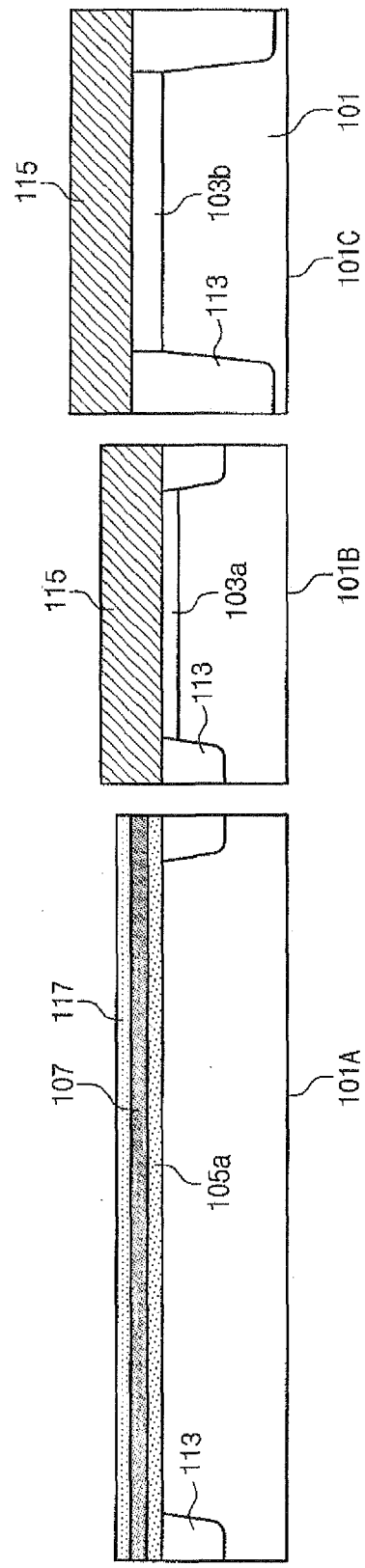

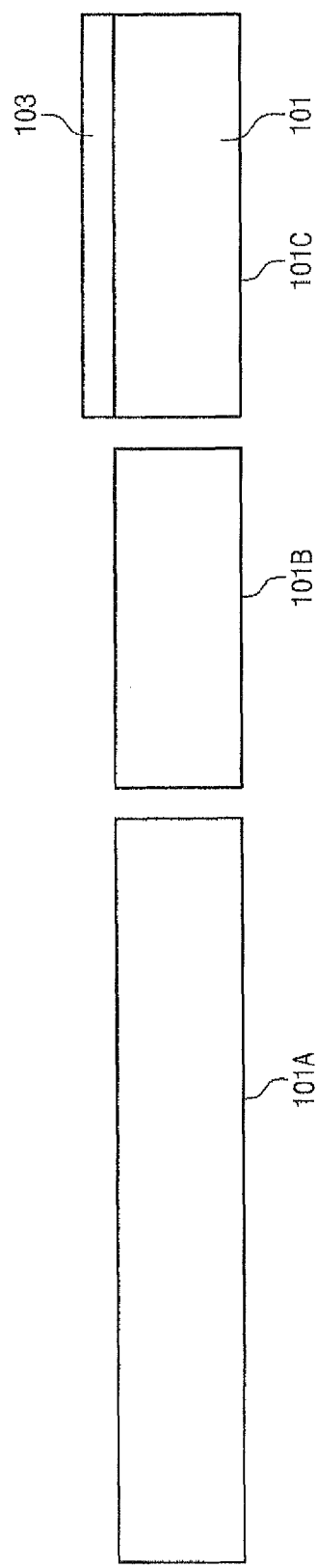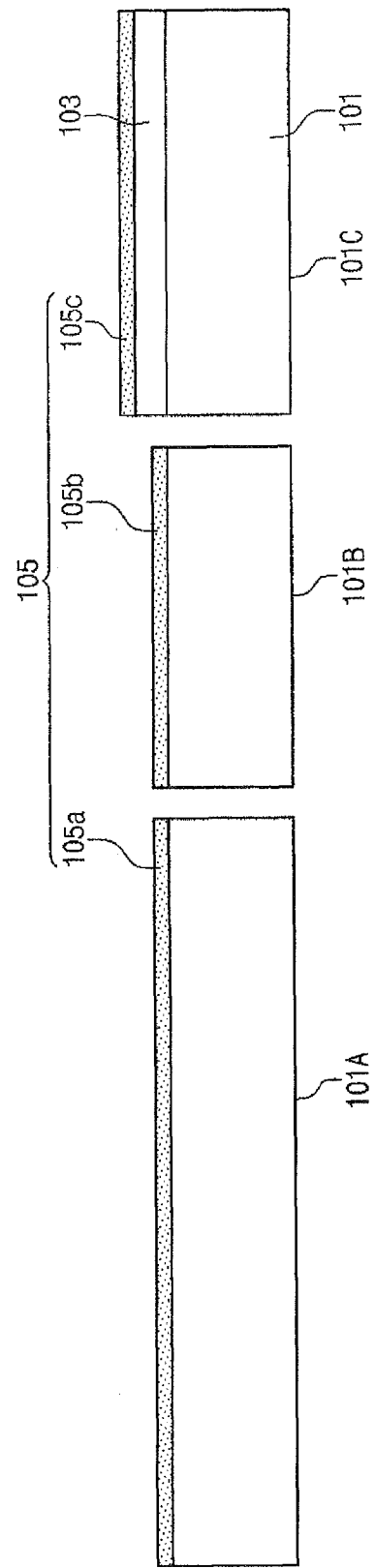

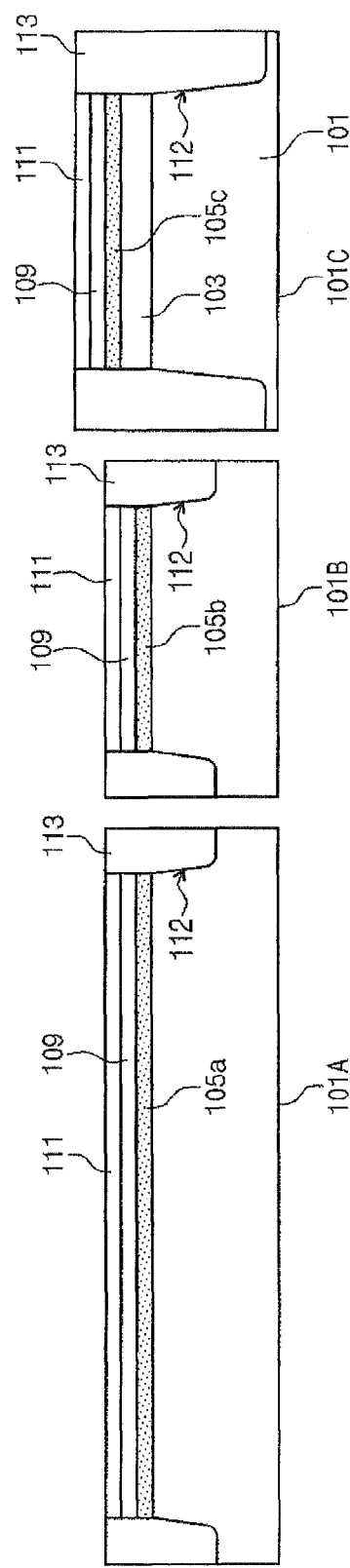
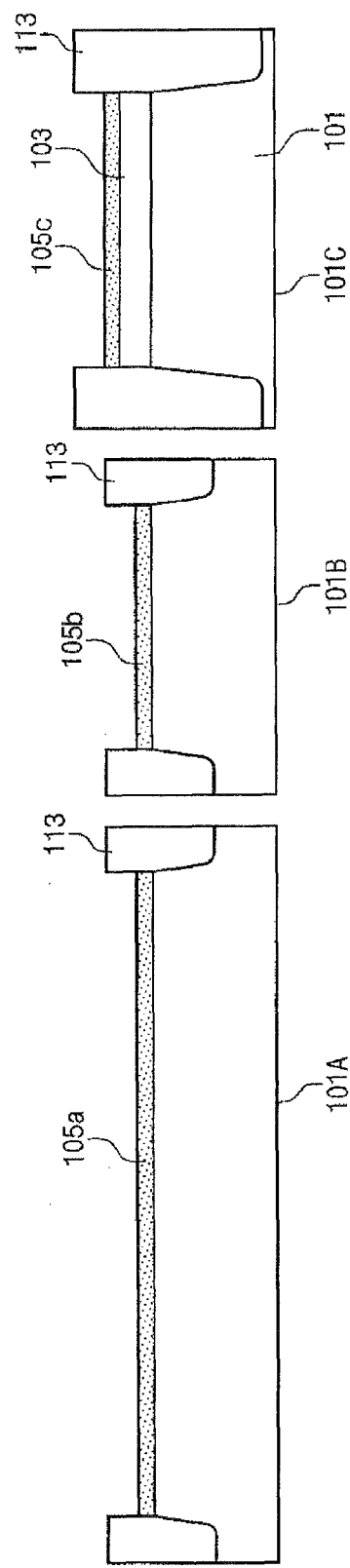
Fig. 5C
Fig. 5D

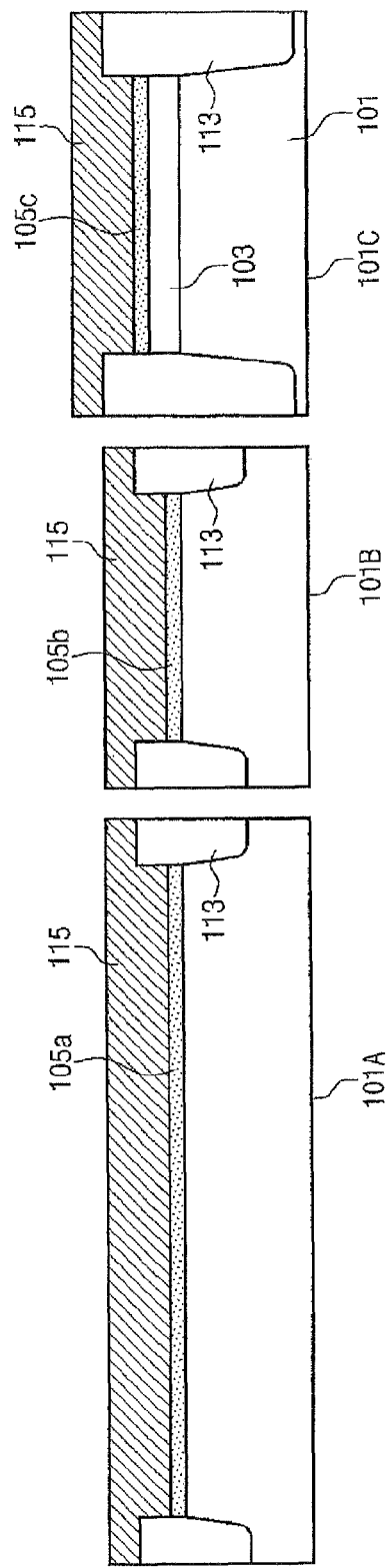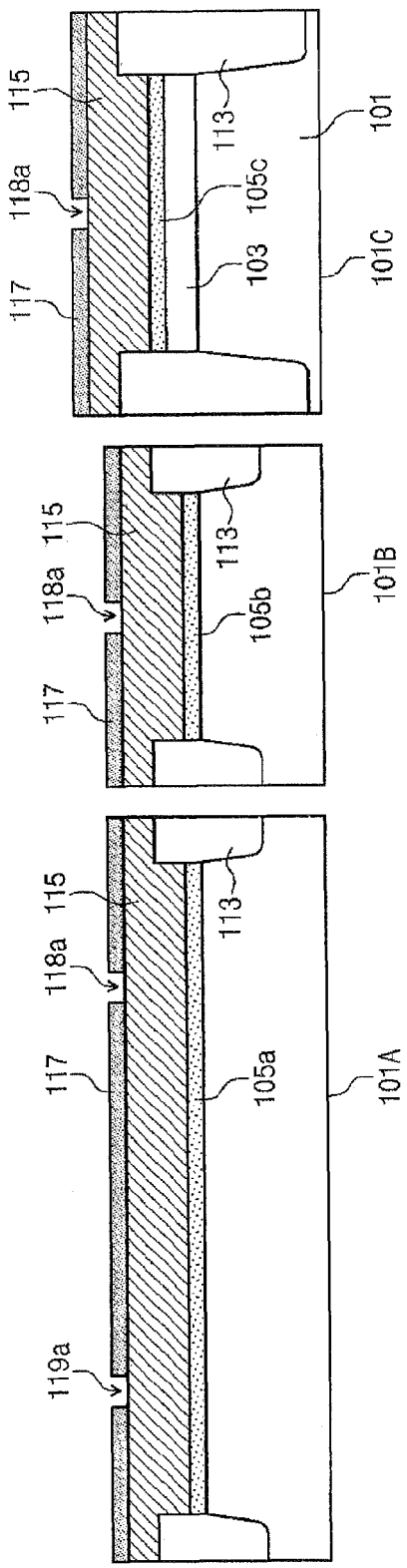

METHOD OF MAKING FLASH MEMORY CELLS AND PERIPHERAL CIRCUITS HAVING STI, AND FLASH MEMORY DEVICES AND COMPUTER SYSTEMS HAVING THE SAME

CROSS-REFERENCE TO RELATED APPLICATIONS

This application is a Divisional of U.S. application Ser. No. 12/367,988 filed on Feb. 9, 2009 now U.S. Pat. No. 7,872,295, which claims priority to Korean Patent Application No. 10-2008-59077, filed on Jun. 23, 2008, in the Korean Intellectual Property Office (KIPO), the disclosures of which are incorporated by reference herein in their entireties.

BACKGROUND OF THE INVENTION

1. Field of the Invention

The present invention generally relates to flash memory devices, and more particularly, to a method of forming flash memory cells and peripheral circuitry of flash memory devices having shallow trench isolation (STI) and flash memory devices produced thereby.

2. Discussion of the Related Art

Non-volatile memory devices, such as flash memory devices, may be provided in a NOR-type configuration or a NAND-type configuration. NAND-type nonvolatile semiconductor memory devices have a plurality of electrically rewritable nonvolatile memory cells connected in series together.

Two types of non-volatile memory cells are floating gate type memory cells and floating trap (charge trap) type memory cells. A floating gate type memory device may include a control gate and a conductive floating gate that is isolated, by an insulating layer, from a field effect transistor (FET) channel formed in a substrate. Floating gate type memory devices may be programmed by storing charges as free carriers on the conductive floating gate.

The multi-tunnel barrier of charge trap type is described in US Patent Nos. 20060198190, 20060202262, 20060202252, the disclosures of which are collectively, incorporated by reference herein. The multi-tunnel barrier of floating gate type is described in U.S. Pat. Nos. 6,784,484 and 7,026,686, the disclosures of which are collectively incorporated by reference herein.

Floating trap (charge trap) type memory devices may include a non-conductive charge storage layer between a gate electrode and a field effect transistor (FET) channel formed in a substrate. Floating trap type memory devices may be programmed by storing charges in traps in the non-conductive charge storage layer.

A floating gate type memory cell is similar to a standard MOSFET transistor, except that it has two gates instead of just one. One gate is the control gate (CG) like in other MOSFET transistors, but the second gate is a floating gate (FG) that is insulated all around by an oxide insulator. The floating gate (FG) is between the control gate (CG) and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the control gate (CG), electrical current will either flow or not flow between the cell's source and drain connections, depending on the threshold voltage (Vt) of the cell. This presence or absence of current is sensed and translated into 1's and 0's, reproducing the stored data.

A conventional floating trap type unit memory device may include a SONOS (silicon-oxide-nitride-oxide-semiconductor) structure (layers). One very basic type of SONOS device may include a polycrystalline silicon ("polysilicon", poly-Si) gate formed over a dielectric layer that includes a silicon nitride layer sandwiched between silicon oxide layers.

A floating trap type non-volatile memory device uses trap levels, such as those found in a silicon nitride layer, for memory operations. When a positive voltage is applied on the gate electrode, electrons are tunneled via the tunneling insulating layer to become trapped in the charge storage layer. As the electrons are accumulated in the charge storage layer, a threshold voltage of the memory device is increased, and the memory device becomes programmed. In contrast, when a negative voltage is applied to the gate electrode, trapped electrons are discharged to the semiconductor substrate via the tunneling insulating layer. Concurrently, holes become trapped by the tunneling insulating layer. Consequently, the threshold voltage of the unit memory device is decreased, and the memory device becomes erased.

Flash memory devices may have three types of transistors which are: the memory cell transistors (implementing non-volatile data-storage memory cells); low voltage transistors; and high voltage transistors. Shallow trench isolation (STI), also known as 'Box Isolation Technique', is an integrated circuit feature that prevents electrical current leakage between adjacent semiconductor device components. STI is generally used on CMOS process technology nodes of 250 nanometers and smaller. STI is typically created early during the semiconductor device fabrication process, before transistors are formed. The key steps of the STI process involve etching a pattern of trenches in the silicon substrate, depositing one or more dielectric materials (such as silicon dioxide) to fill the trenches, and removing the excess dielectric material using a technique such as chemical-mechanical planarization (CMP).

SUMMARY OF THE INVENTION

Floating trap type non-volatile memory devices according to some embodiments of the present invention include a semiconductor substrate and memory cell transistors having gate electrodes. Between the substrate and the gate electrode may be a tunneling insulating layer having a first dielectric constant, a charge storage layer, and a blocking insulating layer. Floating trap type non-volatile memory devices according to some embodiments of the present invention include a semiconductor substrate with a plurality of parallel active regions. A plurality of memory cell transistor gate electrodes are formed over the active regions.

An aspect of the present invention provides an integrated circuit, comprising: a memory cell region having a plurality of memory cell transistors, each memory cell transistor including a tunnel barrier layer formed on a substrate, and a charge storage layer formed above the tunnel barrier layer and a blocking layer formed above the charge storage layer, and its transistor gate electrode formed above the blocking layer; a first trench isolation (TI) formed in the memory cell region for isolating at least one of the memory cell transistors; a peripheral region outside of the memory cell region including low voltage transistors and high voltage transistors, wherein each of the low voltage transistors (LVT) and the high voltage transistors (HVT) includes the tunnel barrier layer; a second trench isolation (TI) formed in the peripheral region for isolating at least one of the low voltage transistors; and a third trench isolation (TI) formed in the peripheral region for isolating at least one of the high voltage transistors, wherein the tunnel barrier layer includes a first dielectric layer and a second dielectric layer.

In preferred embodiments, each of the memory cell transistors, the low voltage transistors and the high voltage transistors is a field effect transistor (FET) having a transistor gate.

The tunnel barrier layer may be formed over the first trench isolation in the memory cell region. The tunnel barrier layer may be formed upon the second trench isolation TI and upon the third trench isolation TI in the peripheral region. The first trench isolation TI in the memory cell region may include oxide, and the tunnel barrier layer is formed upon the first trench isolation TI in the memory cell region. The tunnel barrier layer may be continuously formed in the plurality of memory cell transistors and upon the first trench isolation TI in the memory cell region. The first dielectric layer of the tunnel barrier layer may have a higher K than the second dielectric layer of the tunnel barrier layer. The first dielectric layer of the tunnel barrier layer may comprise SiON, SiN, Al2O3, HfO2, HfSiON, or ZrO2. At least one of the first trench isolation (TI), the second trench isolation (TI) and the third trench isolation (TI) may comprise the same dielectric material as the second dielectric layer of the tunnel barrier layer. The gate dielectric of the HVT may comprises the tunnel barrier layer plus an oxide layer thicker than the tunnel barrier layer.

The third trench isolation TI in the peripheral region may include oxide, and the tunnel barrier layer may be formed upon the third trench isolation TI in the peripheral region.

In alternative embodiments, the tunnel barrier layer is not formed upon the second trench isolation TI and is not formed upon the third trench isolation TI in the peripheral region. And, the tunnel barrier layer may not be formed upon the first trench isolation TI in the memory cell region.

In some embodiments, the tunnel barrier layer formed within the memory cell region further includes a third dielectric layer of the tunnel barrier layer, wherein the first dielectric layer of the tunnel barrier layer is formed over the third dielectric layer of the tunnel barrier layer, and the second dielectric layer of the tunnel barrier layer is formed over the first dielectric layer of the tunnel barrier layer.

In some embodiments, the charge storage layer comprises floating gates of the memory cell transistors.

First and second memory cell transistors may be formed in a NAND type string, wherein the first trench isolation (TI) formed in the memory cell region isolates the string comprising the first and second memory cell transistors. The storage layer and blocking layer of the first memory cell transistor in the string may be patterned disconnected from the storage layer and the blocking layer of a second memory cell transistor in the string.

Another aspect of the invention provides an integrated circuit, comprising: a memory cell region having a plurality of memory cell transistors, each memory cell transistor including a tunnel barrier layer formed on a substrate, and a charge storage layer formed above the tunnel barrier layer and a blocking layer formed above the charge storage layer, and its transistor gate electrode formed above the blocking layer; a first trench isolation (TI) formed in the memory cell region for isolating at least one of the memory cell transistors, wherein the tunnel barrier layer is formed in each of the plurality of memory cell transistors and upon the first trench isolation TI in the memory cell region.

The integrated circuit may further comprise: a peripheral region outside of the memory cell region including low voltage transistors (LVT) and high voltage transistors (HVT); a second trench isolation (TI) formed in the peripheral region for isolating at least one of the low voltage transistors; a third trench isolation (TI) formed in the peripheral region for isolating at least one of the high voltage transistors.

The tunnel barrier layer may includes a first dielectric layer and a second dielectric layer, wherein the first dielectric layer of the tunnel barrier layer has a higher K than the second dielectric layer of the tunnel barrier layer. The first dielectric layer of the tunnel barrier layer may comprise SiON, SiN, Al2O3, HfO2, HfSiON, or ZrO2.

The first and second memory cell transistors among the memory cell transistors may be formed in a NAND type string, wherein the first trench isolation (TI) formed in the memory cell region isolates the string comprising the first and second memory cell transistors.

The gate dielectric of the low voltage transistors (LVT) may consists essentially of the tunnel barrier layer. The gate dielectric of the high voltage transistors (HVT) may comprise the tunnel barrier layer and an oxide layer. The tunnel barrier layer may be formed upon the second trench isolation (TI) formed and upon the third trench isolation (TI).

In alternative embodiments, none of the low voltage transistors (LVT) and the high voltage transistors (HVT) includes the tunnel barrier layer.

The gate oxide layer of the HVT may be thicker than the gate oxide layer of the LVT.

Another aspect of the invention provides a method of forming an integrated circuit on a substrate, the integrated circuit having a memory cell region including a plurality of memory cell transistors each having a gate electrode, and a peripheral region including low voltage transistors (LVT) and high voltage transistors (HVT) outside of the memory cell region. The method comprises: forming a first trench isolation (TI) within the memory cell region for isolating at least one of the memory cell transistors, and forming a second trench isolation (TI) for isolating at least one of the low voltage transistors (LVT) and forming a third trench isolation (TI) for isolating at least one of the high voltage transistors (HVT); and forming a tunnel barrier layer having first and second dielectric layers within the memory cell region between the gate electrodes of the memory cell transistors and the substrate, and within the peripheral region.

Forming the tunnel barrier layer within the peripheral region may include forming the tunnel barrier layer within the low voltage transistors (LVT) and within the high voltage transistors (HVT). The step of forming the tunnel barrier layer may comprises the substeps of: forming the first dielectric layer; forming the second dielectric layer upon the first dielectric layer; and forming a third dielectric layer upon the a second dielectric layer, wherein the first dielectric layer is an oxide layer, the second dielectric layer is a nitride layer, and the third dielectric layer is an oxide layer.

In some embodiments, the first, second, and third trench isolations may be formed prior to forming the tunnel barrier layer, and the tunnel barrier layer is formed upon the first trench isolation. In some such embodiments, the tunnel barrier layer is formed upon the second trench isolation and upon the third trench isolation.

In other embodiments, the first trench isolation, the second trench isolation, and the third trench isolation may be formed after forming the tunnel barrier layer, and the tunnel barrier layer is not formed upon the first trench isolation, nor upon the second trench isolation nor upon the third trench isolation.

In some embodiments of the invention, the step of forming the first trench isolation, the second trench isolation and the third trench isolation may include the substeps of: forming a buffer layer (109) upon the tunnel barrier layer; forming a stopper layer upon the buffer layer; etching the buffer layer, the stopper layer, and the substrate to form the trenches; filling the trenches; and removing the buffer layer and stopper layer.

A method according to this aspect of the invention may further include the steps of: forming a first conductive layer upon the tunnel barrier layer; forming a blocking insulating layer upon the first conductive layer; patterning the blocking insulating layer within the peripheral region to form butting contact holes; patterning the blocking insulating layer within the memory cell region to form gate dielectrics of the memory cell transistors and butting contacts holes; forming a second conductive layer upon the patterned blocking insulating layer and forming butting contacts connecting the first conductive layer and the second conductive layer within the gate electrodes of the LVT and HVT in the peripheral region; and patterning the second conductive layer, the blocking insulating layer, and the first conductive layer within the peripheral region.

Another aspect of the invention provides a method of forming an integrated circuit on a substrate, the integrated circuit having a memory cell region including a plurality of memory cell transistors each having a gate electrode, and a peripheral region including low voltage transistors (LVT) and high voltage transistors (HVT), outside of the memory cell region. The method comprises: forming the gate oxide layer upon the substrate within the peripheral region; forming a first trench isolation (TI) within the memory cell region for isolating at least one of the memory cell transistors, and forming a second trench isolation (TI) for isolating at least one of the low voltage transistors (LVT) and forming a third trench isolation (TI) for isolating at least one of the high voltage transistors (HVT); and forming a tunnel barrier layer having first and second dielectric layers within the memory cell region between the gate electrodes of the memory cell transistors and the substrate, and upon the first trench isolation (TI) in the memory cell region, wherein the gate oxide layer is thicker than the tunnel barrier layer.

The step of forming the tunnel barrier layer may comprises the substeps of: forming the first dielectric layer; forming the second dielectric layer upon the first dielectric layer; and forming a third dielectric layer upon the a second dielectric layer, wherein the first dielectric layer is an oxide layer, the second dielectric layer is a nitride layer, and the third dielectric layer is an oxide layer.

The method may further comprise the steps of: forming a charge storage layer of the memory cell transistors upon the tunnel barrier layer of the within the memory cell region; forming blocking insulating layer of the memory cell transistors within the memory cell region, wherein the blocking insulating layer comprises SiO2, SiN, SiON, HfO2, ZrO, or Al2O3; forming a gate electrode conductive layer upon the blocking insulating layer of the memory cell transistors within the memory cell region; and patterning the blocking insulating layer, the charge storage layer and the gate electrode conductive layer of the memory cell transistors within the memory cell region.

The method may comprise the additional steps of: patterning the blocking insulating layer, the charge storage layer and the gate electrode conductive layer of the memory cell transistors within the memory cell region; forming inner spacers upon the vertical sides of the patterned blocking insulating layer, the charge storage layer and the gate electrode conductive layer of the memory cell transistors within the memory cell region; patterning the blocking insulating layer and the charge storage layer using the inner spacers as a mask; forming outer spacers upon the inner spacers; and doping the substrate using the outer spacers as a mask.

Another aspect of the invention provides a solid state memory module for a computer system, the module comprising: a housing; an interface connector on the housing; a flash memory controller located within the housing; the integrated circuits described above located within the housing and electrically connected to the interface connector, the plurality of memory cell transistors in the integrated circuit being arranged in an array for data storage and controlled by the flash memory controller. The solid state memory module may have an interface connector being an IDE interface connector including a forty IDE pin interface and a power connector. The solid state memory module may be an SD card. The solid state memory module may alternatively have the form factor of a MS (memory stick), CF (compact flash), SMC (smart media), or XD (XD-Picture Card), a hard disk drive, a cardbus card etc.

Another aspect of the invention provides a computer system comprising the solid state memory module described above. The computer system may be a personal computer (PC), a personal digital assistant (PDA), an MP3 player, a digital audio recorder, a pen-shaped computer, a digital camera, or a video recorder, etc.

BRIEF DESCRIPTION OF THE DRAWINGS

The above and other features of the present invention will become readily apparent by reference to the following detailed description when considered in conjunction with the accompanying drawings wherein:

FIGS. 3*a* through 3*e* are cross-sectional views depicting the steps of a method of fabricating the memory device of FIG. 3*f*;

FIGS. 5*a* through 5*g* are cross-sectional views depicting the steps of a method of fabricating the memory device of FIG. 5*h*.

DETAILED DESCRIPTION OF EXEMPLARY EMBODIMENTS OF THE INVENTION

Figure 1:
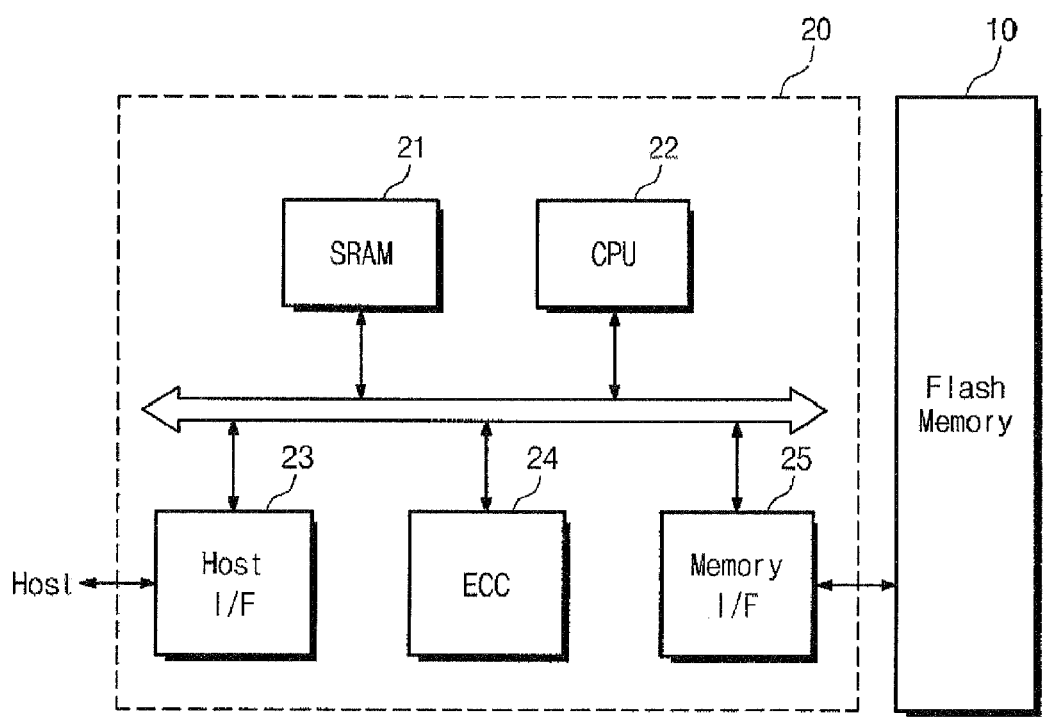
FIG. 1 is a block diagram of a computer system including a removable memory card including a flash memory device according to an embodiment of the present invention.

The present invention is described more fully hereinafter with reference to the accompanying drawings, in which exemplary embodiments of the present invention are shown.

The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity of illustration.

It will be understood that when an element or layer is referred to as being "on," "upon", "connected to" or "coupled to" another element or layer, it can be directly on, upon, connected or coupled to the other element or layer, or intervening elements or layers may be present. In contrast, when an element is referred to as being "directly on," "directly connected to" or "directly coupled to" another element or layer, there are no intervening elements or layers present. Like reference numerals refer to like elements throughout the figures. As used herein, the term "and/or" includes any and all combinations of one or more of the associated listed items.

It will be understood that, although the terms first, second, third etc. may be used herein to describe various elements, components, regions, layers and/or sections, these elements, regions, layers and/or sections should not be limited by these terms. These terms are only used to distinguish one element, region, layer or section from another element, region, layer or section. Thus, a first element, region, layer or section discussed below could be termed a second element, region, layer or section without departing from the teachings of the present invention.

Spatially relative terms, such as "beneath," "below," "lower," "above," "upper", "vertical", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIG. 1 is a block diagram of a computer system including a computer 20 hosting a removable memory card 10 including a flash memory device according to an embodiment of the present invention. The memory card 10 further includes a flash memory controller (not shown) which controls data flow and commands between a memory interface I/F 25 in the host computer 20 and the flash memory cells (not shown) in the memory card 10. Examples of the computer 20 include personal computers, file servers, peripheral devices, wireless devices, digital cameras, personal digital assistants (PDA's), MP3 audio players, MPEG video players, and audio recorders. The removable memory card will typically have a housing that has a predetermined form factor and interface, such as SD (Secure Digital), MS (memory stick), CF (compact flash), SMC (smart media), MMC (multi media), or XD (XD-Picture Card), PCMCIA, CardBus, IDE, EIDE, SATA, SCSI, universal serial bus e.g., a USB flash drive) etc.

It will be appreciated by those skilled in the art that additional circuitry and control signals can be provided, and that the computer system of FIG. 1 has been simplified.

Figure 2A:
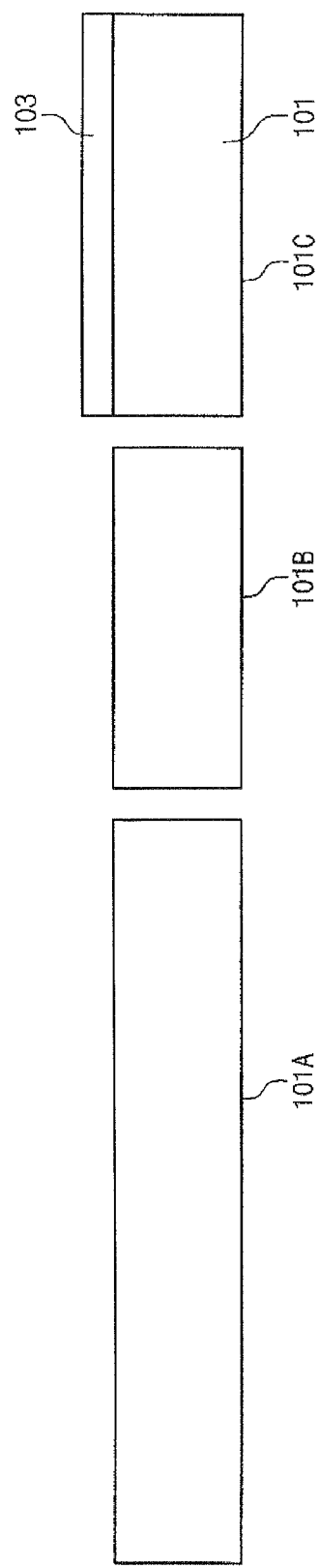
FIGS. 2*a* through 2*e* are cross-sectional views depicting the steps of a method of fabricating the memory device of FIG. 2*f*.
Figure 2B:
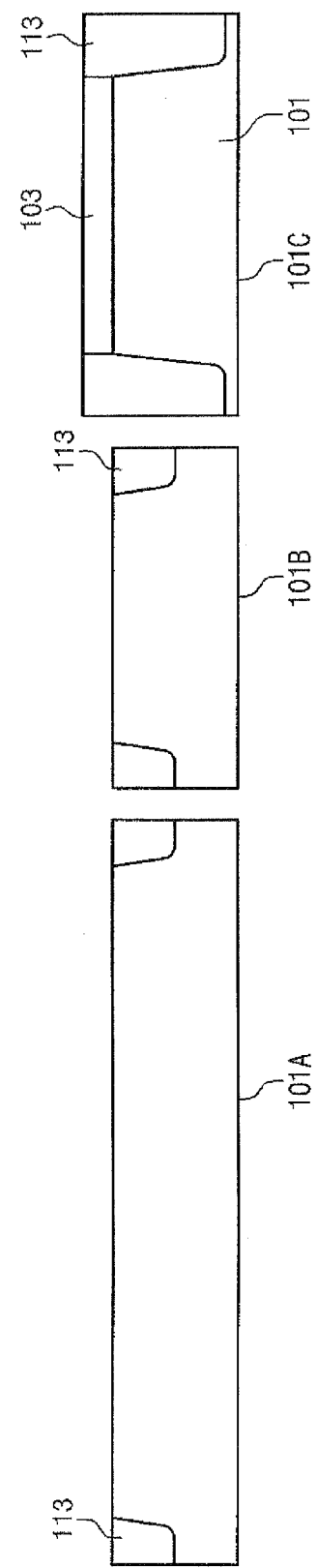
Figure 2C:
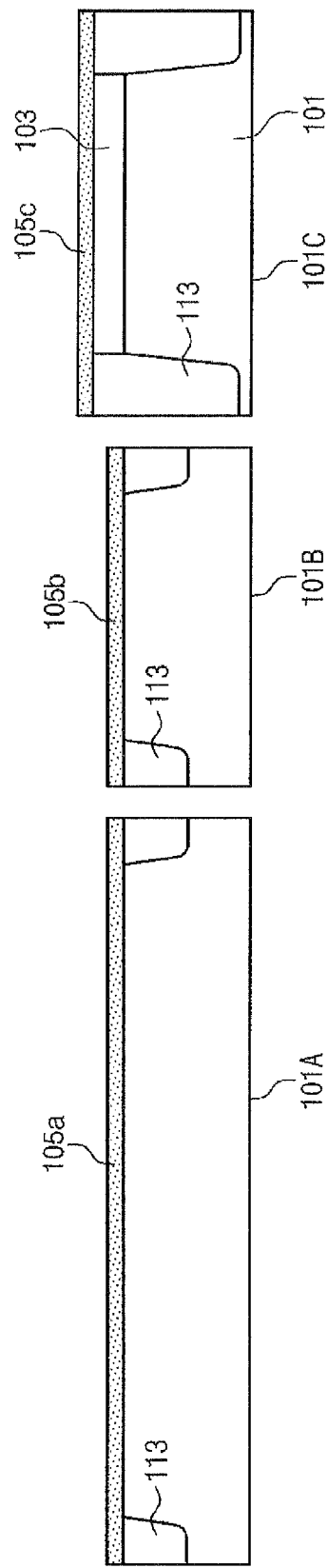
Figure 2D:
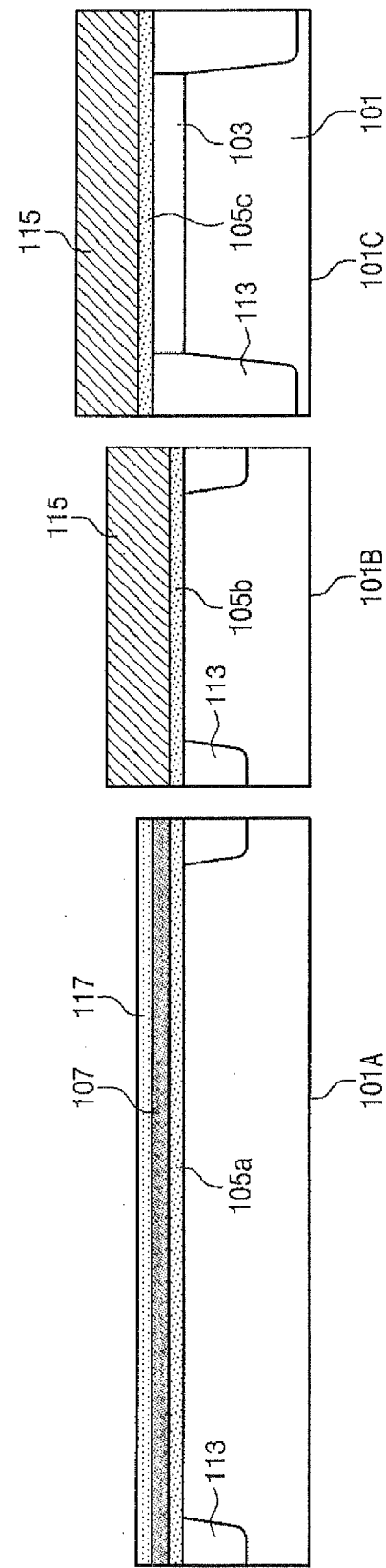
Figure 2E:
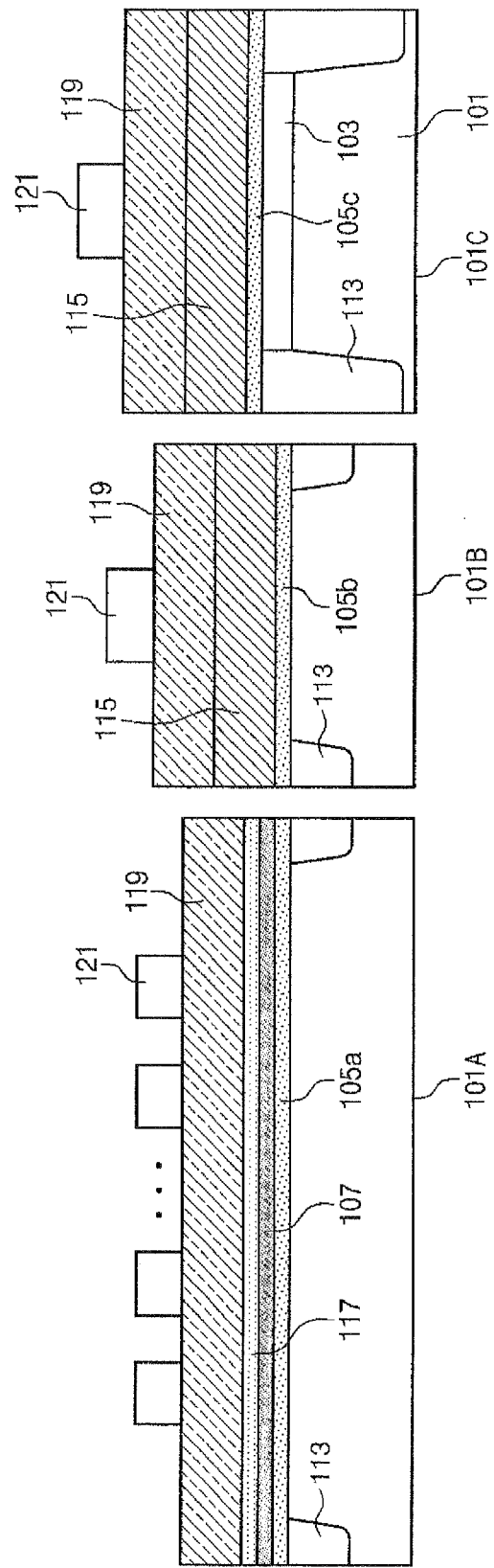
Figure 2F:
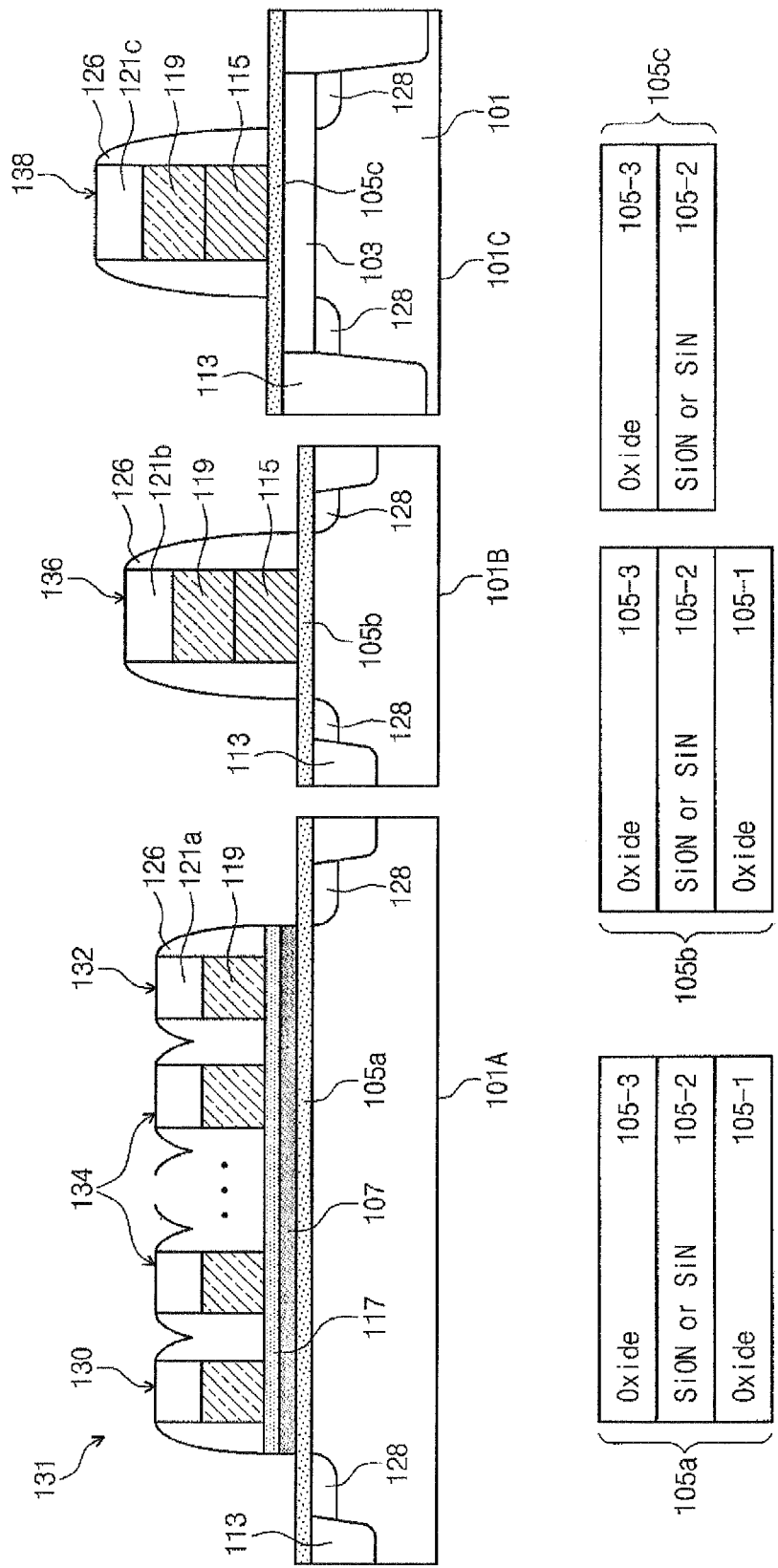
FIG. 2*f* is a side cross-sectional view of three portions of an integrated circuit containing a memory device according to an embodiment of the present invention.

FIG. 2f is a side cross-sectional view of three portions of an integrated circuit containing a memory device according to an embodiment of the present invention. FIG. 2f shows the structure of transistors in the memory device, formed in an integrated circuit on a substrate 101, according to an exemplary embodiment of the invention. In some embodiments of the present invention, the substrate 101 may include an intrinsic semiconductor (e.g., single crystal silicon, germanium, silicon-germanium, etc.) substrate, a silicon-on-insulator (SOI) substrate, a substrate having a thin film obtained by a selective epitaxial growth (SEG) process, etc. The memory device of FIG. 2f includes an array of non-volatile memory cells 131, and peripheral circuitry including address circuitry, control circuitry, and Input/Output (I/O) circuitry formed of low voltage transistors (LVTs) 136 and/or high voltage transistors (HVTs) 138. The memory cells 131 are also referred to as flash memory cells wherein blocks of memory cells can be erased concurrently in a flash operation.

Referring to FIG. 2f, in a first (memory cell) portion (portion "a" on the left side of FIG. 2f) of the integrated circuit, the memory device contains a plurality of memory cells 131 connected in series (NAND-flash configuration) formed on a substrate 101 (101a). The first transistor 130 and last transistor 132 in each string may be a string selection transistor (SST) (also known as a Bit Line Select Transistor) and the Ground Select Transistor (GST) respectively, while the middle transistors 134 constitute data storage cells.

In a second portion (middle of FIG. 2f) of the integrated circuit, a plurality of low voltage transistors (LVT) 136 of the memory device are formed in a peripheral area of the integrated circuit formed on the substrate 101b. In a third portion (right side of FIG. 20 of the integrated circuit, the memory device contains a plurality of high voltage transistors (LVT) 138 formed on the substrate 101. Thus, the flash memory device in FIG. 2f may have three types of transistors which are composed of memory cells 131, low voltage transistors (LVT) 136 and high voltage transistors (HVT) 138. The low voltage transistors (LVT) 136 and high voltage transistors (HVT) 138 may comprise the peripheral circuitry of the memory device. The corresponding tunnel barrier layer portions 105a, 105b and 105c in the three types of transistors 131, LVT 136 and HVT 138 may be formed approximately simultaneously using the same process steps without patterning.

Referring to FIG. 2f, a memory device includes a substrate 101 (101A, 101B, and 101C) and a patterned transistor gate electrode layer (115 and/or 119). Although only some patterned gate electrode structures (forming memory cells 131, LVT 136 and HVT 136) are depicted in FIG. 2f, it will be appreciated that the integrated circuit including the memory device may include a large number of patterned gates comprising memory cells and peripheral circuitry.

In the memory cells 131, between the substrate 101a and the patterned gate electrode layer 119 is a tunneling insulating layer 105a having a first dielectric constant, a charge storage layer 107, and a blocking insulating layer 117 having a second dielectric constant that may be greater than the first dielectric constant. The blocking insulating layer 117 may be formed of material selected from one of O/N/O, O/high-k/O, $SiO_2$, SiN, SiON, $HfO_2$, $ZrO_2$, $Al_2O_3$ or any combination thereof.

The tunneling insulating layer (tunnel barrier layer) 105a, the charge storage layer 107, the blocking insulating layer 117, and the gate electrode (comprised of first conductive layer 115 and/or a second conductive layer 119) are sequentially stacked over an active (channel) region of a doped (e.g., P-type) semiconductor substrate 101. As shown, two N+ type impurity diffusions 128 are formed on opposite sides of transistor channels and bound the active regions within memory cell portion "a" of the substrate 101.

In this exemplary embodiment, the tunnel barrier (105a) within a memory cell 131 formed in portion "a" of the substrate 101 may have three layers (e.g., 105-1, 105-2, 105-3). The first layer 105-1 is an oxide layer that may be formed by an oxidation process (e.g., by thermal oxidation), or by chemical vapor deposition (CVD). The second layer 105-2 may comprise SiON, SiN or other high-k material, e.g., $Al_2O_3$, $HfO_2$, HfSiON, $ZrO_2$, or a mixture thereof and may be formed by an atomic layer deposition (ALD) deposition process or by chemical vapor deposition (CVD).

According to other embodiments of the present invention, the second layer 105-2 of the tunnel barrier may comprise metallic oxide or metallic oxynitride of a group III element or group VB element in the Mendeleev Periodic Table. According to other embodiments, the second layer 105-2 of the tunnel barrier may comprise doped metal oxide or doped metal oxynitride in which metal oxide is doped with a group IV element in the Mendeleev Periodic Table. The group IV element may be doped with a metal oxide of about 0.1-30 weight percent. The second layer 105-2 of the tunnel barrier may also comprise one of $La_2O_3$, $Hf_{1-x}Al_xO_y$, $Hf_xSi_{1-x}O_2$, $Zr_xSi_{1-x}O_2$, Zr—Si-oxynitride, or any combination thereof.

The third layer 105-3 of the tunnel barrier 105 is an oxide layer that may be formed by an anneal process, or by chemical vapor deposition (CVD). In various other exemplary embodiments, the tunnel barrier (105a) in the memory cells 131 may consist essentially of two layers (e.g., 105-1, 105-2) including the second ("nitride") layer 105-2. In other exemplary embodiments, the tunnel barrier (105a) in the memory cells 131 may consist essentially of one layer including the second ("nitride") layer 105-2.

In the present exemplary embodiment shown in FIG. 2f, the tunnel barrier layer 105a, 105b, 105c is formed after the completion of at least one shallow trench isolation (STI) process has formed a plurality of STIs 113 throughout the various portions of the substrate 101 (101A, 101B, 101C). Thus, the tunnel barrier layer 105 (105a, 105b, 105c) is formed over the oxide-filled STI trenches formed in each portion "a", "b", and "c" of the substrate 101 (101A, 101B, 101C). The STI trench-fill material may be formed of the same oxide composition as the material of the first (oxide) layer 105-1 of the tunnel barrier layer 105a, 105b, 105c. Thus, in effect, over the oxide-filled STI trenches in at least portion "a", "b", of the substrate 101 (101A, 101B), there are two layers which comprise the second (105-2) and the third (105-3) layers of the tunnel barrier layer 105a, 105b, 105c. In some embodiments, the tunnel barrier layer 105 (105a, 105b, 105c) formed within all of the three portions "a", "b" and "c" of the integrated circuit may be formed in one series of process steps that does not include patterning of one or more of the component layers 105-1, 105-2, 105-3.

In the exemplary embodiment shown in FIG. 2f, the tunnel barrier layer 105 (105b) comprised of three layers (105-1, 105-2, 105-3) is the gate dielectric between the gate electrode 115/119 of the low-voltage transistor (LVT) and its channel in the semiconductor substrate 101b.

A thicker gate dielectric (oxide dielectric layer 103) is typically required between the gate electrode 115/119 of the high-voltage transistor (HVT) and its channel in the semiconductor substrate 101c. Thus, the tunnel barrier layer 105c in the high voltage transistor (HVT) in the peripheral portion "c" of the integrated circuit in effect comprises the second (105-2) and the third (105-3) layers formed over a thick first oxide layer 103c (thicker 105-1).

The charge storage layer 107 may include nitrided silicon (e.g., $Si_3N_4$ or silicon oxynitride SiON) silicon-rich oxide or ferroelectric material. Charge trap technology is described in U.S. Pat. Nos. 6,858,906, 7,253,467, and Application No. 20060180851, the disclosures of which are collectively incorporated by reference herein in their entirety.

A layer of photoresist material 121 (121a, 121b, 121c) is patterned over the conductive layer(s) 115 and/or 119 and then the conductive layer(s) 115 and/or 119 are etched and thereby patterned to form the gate electrodes of the individual transistors 130, 134, 132, 136, 138. The memory device according to this embodiment may further include a spacer 126 formed on the vertical sides of the patterned gate electrodes of the transistors. The spacer 126 and the patterned photoresist material 121 may be used to pattern the charge storage layer 107 and the blocking insulating layer 117 formed over tunnel barrier layer 105a. The spacer 126 and the patterned gate electrodes 115/119 may be used to pattern the doping of the diffusion regions 128 in the substrate 101 (101A, 101B, 101C).

FIGS. 2a through 2e are cross-sectional views depicting the steps of a method of fabricating the memory device of FIG. 2f.

Referring to FIG. 2a, a thick gate dielectric (oxide) layer 103 is formed on the top of the substrate 101C for the gate dielectric of high-voltage transistors (HVT) in the "c" portion of the integrated circuit.

Referring to FIG. 2b, a patterned mask layer (not shown) is formed on the substrate 101 and on the HVT gate dielectric oxide 103. Using the patterned mask, portions of the substrate 101 (101A, 101B, 101C) and of the HVT gate dielectric oxide 103 are removed to form trenches in the substrate 101. A trench filling material (e.g., silicon oxide) is formed on the resultant structure to fill the trenches. The trench filling is partially removed by a chemical mechanical polishing (CMP) to expose the mask layer, thereby forming active semiconductor regions (between STI trenches 113). Subsequently, a top portion of the STI fill is recessed, i.e., partially removed along with the patterned mask so that the top surface of the STI is at the height of the top surface of the HVT gate dielectric oxide 103.

Referring to FIG. 2c, the tunnel barrier layer 105 (105a, 105b, 105c) is formed without patterning upon all of the three portions "a", "b" and "c" of the integrated circuit.

Referring to FIG. 2d, the first conductive layer 115 (e.g., a polysilicon gate layer) is formed upon portions "b" and "c" of the integrated circuit. The charge storage layer 107 is formed upon the tunnel barrier layer 105 within memory cell portion "a" of the integrated circuit. The blocking insulating layer 117 is formed upon the charge storage layer 107 within memory cell portion "a" of the integrated circuit. The blocking insulating layer 117 can for example be deposited by a technique such as atomic layer chemical vapor deposition (ALCVD).

Referring to FIG. 2e, the second conductive layer 119 is formed upon the blocking insulating layer 117 within memory cell portion "a" and directly upon the first conductive layer 115 within the LVT and HVT portions "b" and "c" of the integrated circuit. Then a patterned photoresist layer 121 is formed as a gate mask upon the second conductive layer 119. Then the regions of the first conductive layer 119 and second conductive layer 115 not covered (overlapped) by the patterned photo resist layer 121 are etched away to form the individual gate electrodes of the transistors 130, 132, 134, 136, and 138. Then the vertical sides of patterned gate electrodes of individual transistors 130, 132, 134, 136, and 138 are covered with spacer (e.g., oxide) 126 (see FIG. 2f). The portions of the charge storage layer 107 and the blocking insulating layer 117 not covered (overlapped) by the spacer (e.g., oxide) 126 or the patterned photoresist layer 121 are removed. And then N+ type impurity diffusions 128 are formed on opposite sides of transistor channels within the substrate 101. Thus transistors of the storage cells 134 of the memory cell 131, the low-voltage transistors (LVT) 136 and the high-voltage transistors (HVT) 138 are completed.

As a result, the tunnel barrier layer 105, the first charge storage layer 107, the blocking insulating layer 117, the gate electrode layer 115/119 and the patterned photoresist layer 121 are formed on active regions in all of portions "a", "b" and "c" of the integrated circuit. And the tunnel barrier layer 105 (105a, 105b, 105c) covers (overlaps) the STI fill in each of portions "a", "b" and "c" of the integrated circuit.

Figure 3A:
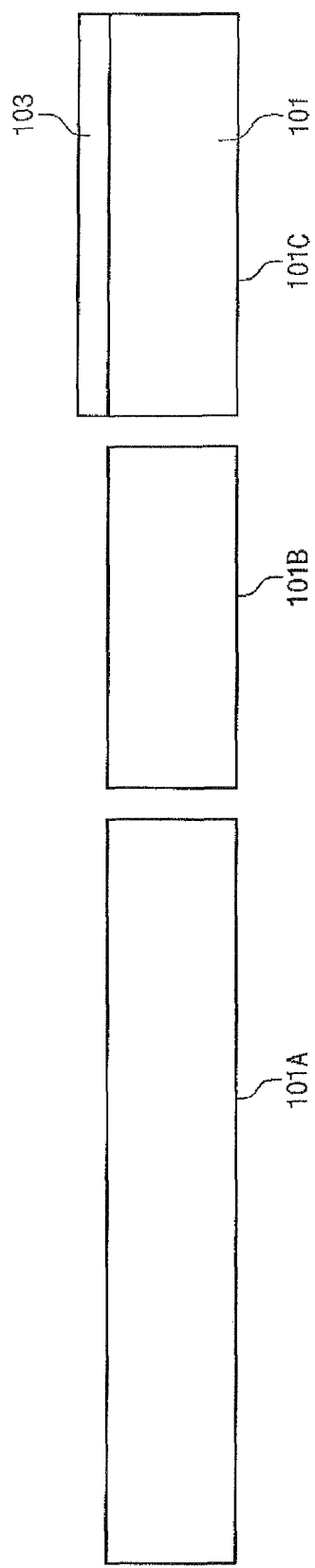
Figure 3B:
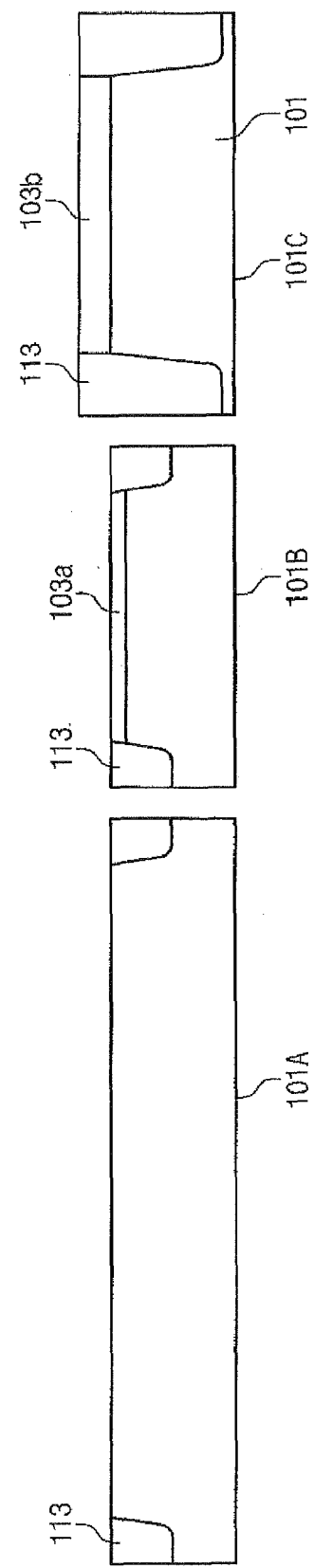
Figure 3E:
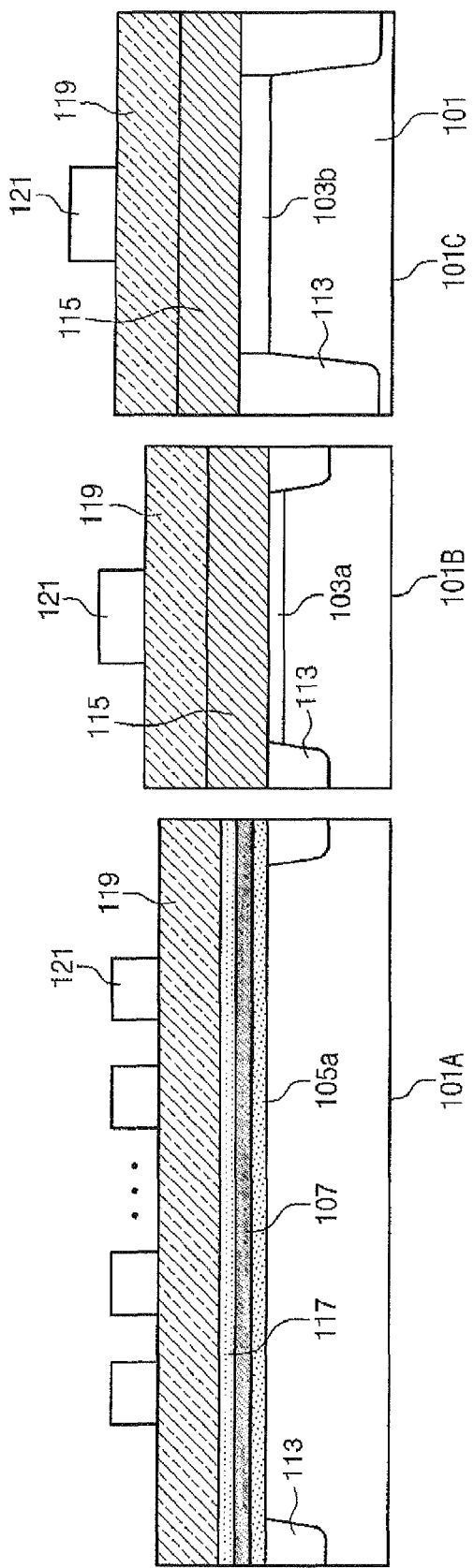
Figure 3F:
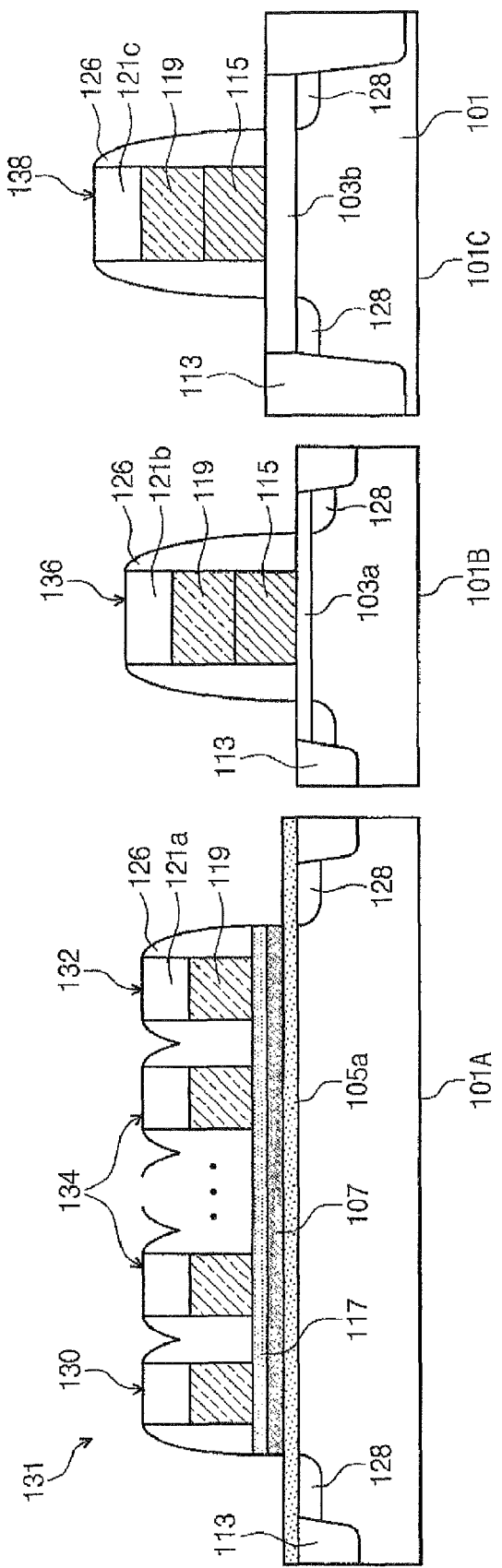
FIG. 3*f* is a side cross-sectional view of three portions of an integrated circuit containing a memory device according to another embodiment of the present invention.

FIG. 3f is a side cross-sectional view (e.g., parallel with a bit line not shown) of three portions of an integrated circuit containing a memory device according to another embodiment of the present invention. FIG. 3f shows the structure of transistors in the memory device, formed in an integrated circuit on a substrate 101, according to another exemplary embodiment of the invention. The memory device of FIG. 3f is similar to the memory device of FIG. 2f except that the structure of low-voltage transistors LVT and of high-voltage transistors HVT in the memory device of FIG. 3f is different from those in the memory device of FIG. 2f. The structure of transistors in the memory cells 131 (transistors 130, 124, 132) in the memory device of FIG. 3f are the same as in the memory device of FIG. 2f and a redundant description thereof will be omitted.

Referring to FIG. 3f, in the second portion (portion "b" in middle of FIG. 3f) of the integrated circuit, the plurality of low voltage transistors (LVT) 136 of the memory device formed in the peripheral area of the integrated circuit include gate dielectric 103b, which can be made essentially of oxide. In the third portion (portion "c" on right side of FIG. 3f) of the integrated circuit, the plurality of high voltage transistors (LVT) 138 have gate dielectrics 103c which can also be made essentially of oxide. As shown in FIG. 3f, the respective gate dielectrics 103b and 103c of the low voltage transistors (LVT) 136 and of high voltage transistors (LVT) 138 do not contain the second ("nitride") layer 105-2 of the tunnel barrier layer (105a) that is formed over the substrate within the memory cell portion "a" of the memory device. The gate dielectric (oxide) 103c of the high-voltage transistor (HVT) 138 may be thicker than the gate dielectric (oxide) 103b of the low-voltage transistors (LVT) 136.

FIGS. 3a through 3e are side cross-sectional views depicting the steps of a method of fabricating the memory device of FIG. 3f.

Referring to FIG. 3a, a dielectric (oxide) layer 103 is formed on the top of the high-voltage transistor (HVT) portion "c" of the substrate 101 for the gate dielectric of high-voltage transistors (HVT) in the "c" portion of the integrated circuit.

Referring to FIG. 3b, a second dielectric (oxide) layer is formed on the top of the portions "b" and "c" of the substrate 101 to form the gate dielectric oxide layer 103b of the low voltage transistors (LVT) and the thicker gate dielectric oxide layer 103c of the high-voltage transistors (HVT) in the "b" and "c" portions of the integrated circuit. Then, a patterned mask layer (not shown) is formed on the substrate 101 and on the LVT gate dielectric oxide 103b and on the HVT gate dielectric oxide 103c. Using the patterned mask, portions of the substrate 101 and of the LVT and HVT gate dielectric oxides 103a and 103b are removed to form trenches in the substrate 101. A trench filling material (e.g., silicon oxide) is formed on the resultant structure to fill the trenches. The trench filling is partially removed by a chemical mechanical polishing (CMP) to expose the mask layer, thereby forming active semiconductor regions (between STI trenches 113). Subsequently, a top portion of the STI fill is recessed, i.e., partially removed along with the patterned mask so that the top surface of the STI is at the height of the top surface of the gate dielectric oxides 103b and 103c.

Referring to FIG. 3c, the first conductive layer 115 (e.g., a polysilicon gate layer) is formed upon portions "b" and "c" of the integrated circuit, overlapping the STIs 113.

Referring to FIG. 3d, the tunnel barrier layer 105a, the charge storage layer 107 and the blocking insulating layer 117 are sequentially formed upon the memory cell portion "a" of the substrate, overlapping the STIs 113.

Referring to FIG. 3e, the second conductive layer 119 (e.g., a polysilicon gate layer) is formed upon all of portions "a", "b" and "c" of the integrated circuit. The second conductive layer 119 may be formed directly upon the first conductive layer 115 within the LVT and HVT portions "b" and "c" of the integrated circuit. Then a patterned photo resist layer 121 is formed as a gate mask upon the second conductive layer 119.

Referring to FIG. 3f, the regions of the first conductive layer 119 and second conductive layer 115 not covered (overlapped) by the patterned photo resist layer 121 are etched away to form the individual gate electrodes of the transistors 130, 132, 134, 136, and 138. Then the vertical sides of patterned gate electrodes of individual transistors 130, 132, 134, 136, and 138 are covered with spacer (e.g., oxide) 126. The portions of the charge storage layer 107 and the blocking insulating layer 117 not covered (overlapped) by the spacer (e.g., oxide) 126 or the patterned photoresist layer 121 are removed. And then N+ type impurity diffusions 128 are formed on opposite sides of transistor channels within the substrate 101. Thus transistors of the storage cells 134 of the memory cell 131, the low-voltage transistors (LVT) 136 and the high-voltage transistors (HVT) 138 are formed.

As a result, the tunnel barrier layer 105, the first charge storage layer 107, the blocking insulating layer 117, the gate electrode layer 115/119 and the patterned photoresist layer 121 are formed on active regions in all of portions "a", "b" and "c" of the integrated circuit. And the tunnel barrier layer 105 (105a) covers (overlaps) the STI in memory cell portions "a", but not portions "b" and "c", of the integrated circuit. However, the first charge storage layer 107, the blocking insulating layer 117 do not overlap any STI in the integrated circuit.

Figure 4:
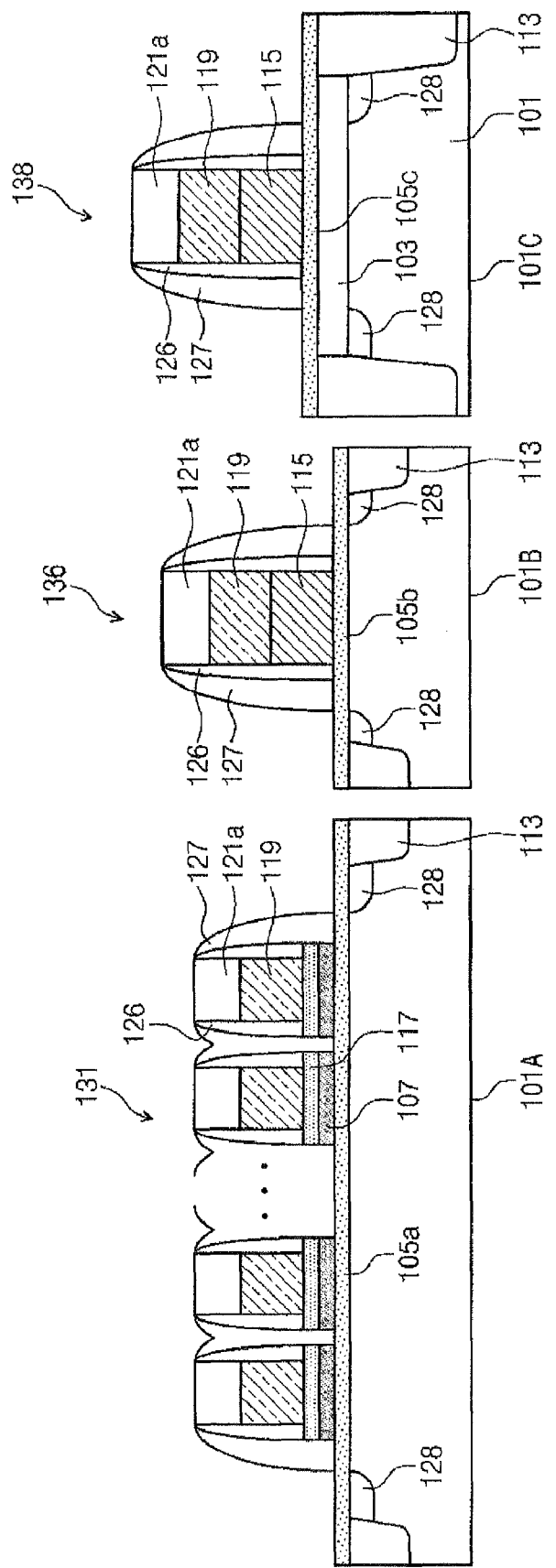
FIG. 4 is a side cross-sectional view of three portions of an integrated circuit containing a memory device according to another embodiment of the present invention.

FIG. 4 is a cross-sectional view (e.g., parallel with a bit line) (not shown) of three portions of an integrated circuit containing a memory device according to another embodiment of the present invention. FIG. 4 shows the structure of transistors in the memory device, formed in an integrated circuit on a substrate 101, according to another exemplary embodiment of the invention.

The memory device of FIG. 4 is similar to the memory device of FIG. 2f except that the layers of the transistors formed after the tunnel barrier layer 105 (105a, 105b, 105c) are patterned differently and the doping of the N+ type impurity diffusions in the substrate (101b, 101c) are patterned differently. These differences are due to the use of two spacers, inner spacer 126 and outer spacer 127, as patterned doping masks.

Referring to FIG. 4, the corresponding tunnel barrier layer portions 105a, 105b and 105c in the three types of transistors 131, LVT 136 and HVT 138 may be formed approximately simultaneously using the same process steps without patterning any of the component layers 105-1, 105-2 and 105-3. Afterwards, a charge storage layer 107, and a blocking insulating layer 117 are sequentially formed within the memory cell 131 portion "a" of the integrated circuit. Afterwards conductive layer(s) 115 and/or 119 are formed. Afterwards, a layer of photoresist material 121 (121a, 121b, 121c) is patterned over the conductive layer(s) 115 and/or 119. Then the conductive layer(s) 115 and/or 119 are etched and thereby patterned to form the gate electrodes of individual transistors 131, 136, 138 in all portions "a", "b" and "c" of the integrated circuit. Afterwards, an inner spacer is formed upon the vertical sides of the patterned gate electrodes of individual transistors in all of portions "a", "b" and "c" of the integrated circuit. Afterwards, the inner spacer 126 is used as a mask, to cut (pattern) the blocking insulating layer 117 and charge trap layer 107 (forming individual charge storage regions) within the memory cell 131 portion "a" of the integrated circuit. Afterwards, an outer spacer 127 is formed upon the approximately vertical sides of the inner spacer 126 in all of portions "a", "b" and "c" of the integrated circuit. Afterwards, the outer spacer 127 is used as a mask, to pattern the doping of the N+ type impurity diffusions 128 in the substrate (101*a*, 101*b*, 101*c*) in all of portions "a", "b" and "c" of the integrated circuit. The N+ type impurity diffusions 128 may be formed by ion implantation and/or other diffusion methods. In alternative embodiments, the memory devices shown in FIG. 3*f* may be similarly modified similarly using two spacers (126 and 127) as pattern masks, instead of using only one such spacer 126, to cut (pattern) the blocking insulating layer 117 and charge trap layer 107 (forming individual charge storage regions).

Figure 5G:
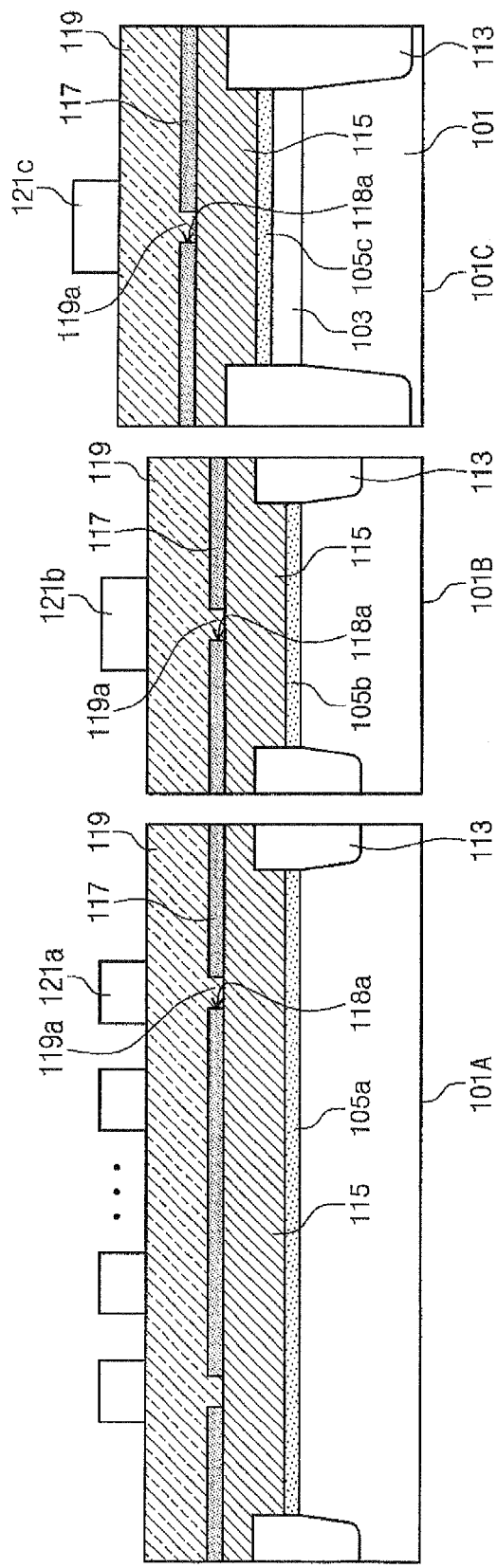
Figure 5H:
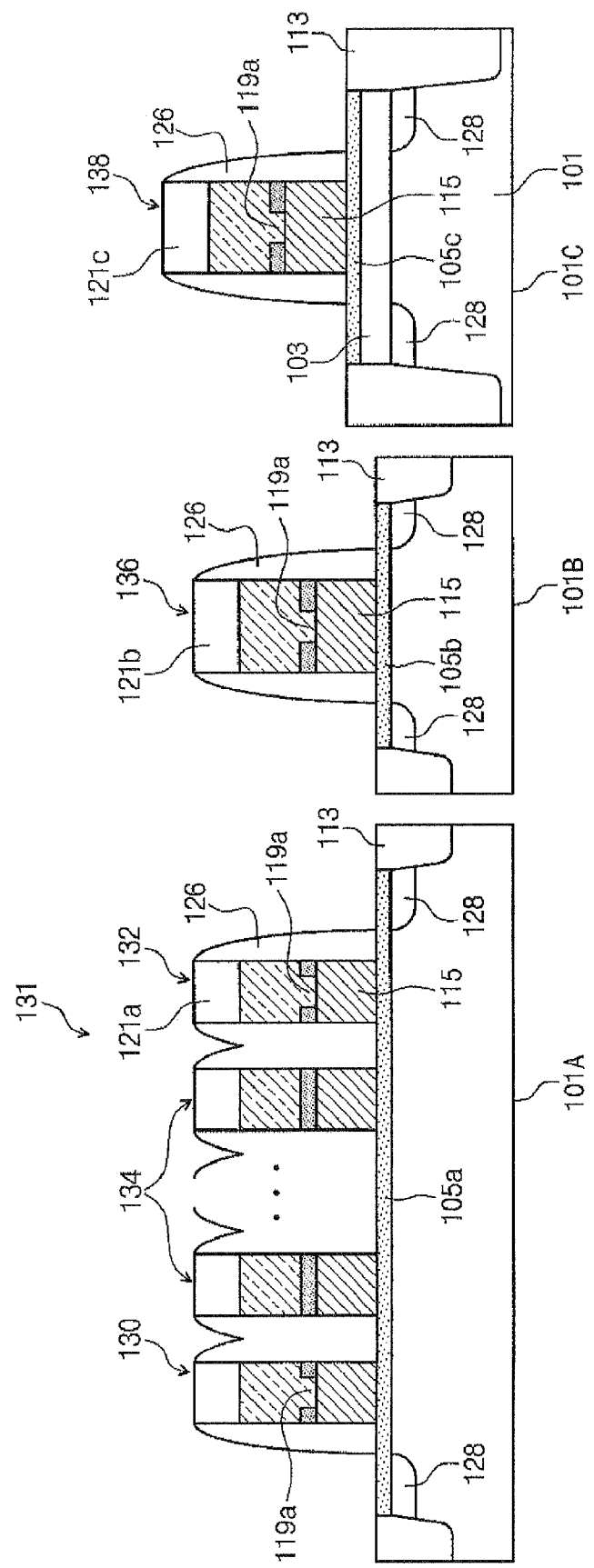
FIG. 5*h* is a side cross-sectional view of three portions of an integrated circuit containing a memory device.

FIG. 5*h* is a side cross-sectional view of three portions of an integrated circuit containing a memory device according to another embodiment of the present invention. FIG. 5*h* shows the structure of transistors in the memory device, formed in an integrated circuit on a substrate 101, according to another exemplary embodiment of the invention.

The memory device of FIG. 5*h* differs from the memory device of FIG. 2*f* in that that some of the layers formed above the tunnel barrier layer 105 (105*a*, 105*b*, 105*c*) are different. This difference is due to the use of a first conductive layer 115 as a charge storage layer (floating gate) of storage cells 134, and the use of butting contacts 119*a* between the first conductive layer 115 and the second conductive layer 119 to form gate electrodes of the other individual transistors 130, 132, 136, 138. The floating gate 115 may consist of highly N-type doped polysilicon. The information that is stored in the memory cell is determined by the charge on the floating gate 115. The readout of the storage cells 134 can be done by using the gate electrodes 119.

In the present exemplary embodiment shown in FIG. 5*h*, the tunnel barrier layer 105 (105*a*, 105*b*, 105*c*) is formed before shallow trench isolation (STI) process has formed a plurality of STIs 113 throughout the various portions of the substrate 101 (101A, 101B, 101C). The tunnel barrier layer 105 (105*a*, 105*b*, 105*c*) including the second ("nitride") layer 105-2 is cut by the oxide-filled STI trenches formed in each portion "a", "b", and "c" of the substrate 101 (101A, 101B, 101C). The tunnel barrier layer 105 (105*a*, 105*b*, 105*c*) including the second ("nitride") layer 105-2 is included in the gate dielectric of each of individual transistors 130, 132, 136, and 138. In the exemplary embodiment shown in FIG. 5*h*, the tunnel barrier layer 105 (105*b*) comprised of three layers (105-1, 105-2, 105-3) is the gate dielectric between the gate electrode 115/119 of the low-voltage transistor (LVT) and its channel in the semiconductor substrate 101*b*. Thus tunnel barrier layer 105 (105*a*, 105*b*, 105*c*) including the second ("nitride") layer 105-2 is the entire gate dielectric of each of individual transistors 130, 132, and 136.

In some embodiments, the tunnel barrier layer 105 (105*a*, 105*b*, 105*c*) formed within all of the three portions "a", "b" and "c" of the integrated circuit may be formed in one series of process steps that does not include patterning (other than by formation of the STI trenches 113) of one or more of the component layers 105-1, 105-2, 105-3.

FIGS. 5*a* through 5*g* are cross-sectional views depicting the steps of a method of fabricating the memory device of FIG. 5*h*.

Referring to FIG. 5*a*, a thick gate dielectric (oxide) layer 103 is formed on the top of the substrate 101C for part of the gate dielectric high-voltage transistors (HVT) in the "c" portion of the integrated circuit.

Referring to FIG. 5*b*, the tunnel barrier layer 105 (105*a*, 105*b*, 105*c*) is formed without patterning upon all of the three portions "a", "b" and "c" of the integrated circuit, directly upon the substrate 100 (101A and 101B) and directly upon the thick gate dielectric (oxide) layer 103.

Referring to FIG. 5*c*, a buffer layer 109 is formed without patterning upon all of the three portions "a", "b" and "c" of the integrated circuit, directly upon the tunnel barrier layer 105 (105*a*, 105*b*, 105*c*). Then, a stopper layer 111 is formed without patterning upon all of the three portions "a", "b" and "c" of the integrated circuit, directly upon the buffer layer 109. Then a patterned mask layer (not shown) is formed upon the stopper layer 111. Using the patterned mask, portions of the stopper layer 111, of the buffer layer 109, of the tunnel barrier layer 105 (105*a*, 105*b*, 105*c*), of the HVT gate dielectric oxide 103, and of the substrate 101 and are removed to form trenches in the substrate 101 (101A, 101B, 101C). A trench filling material (e.g., silicon oxide) is formed on the resultant structure to fill the trenches. The trench filling is partially removed (e.g., by a chemical mechanical polishing (CMP)) to expose the stopper layer 111 and/or the buffer layer 109.

Referring to FIG. 5*d*, the stopper layer 111 and the buffer layer 109 are removed (e.g., by chemical etching) down to the top surface of the tunnel barrier layer 105, leaving recesses between and lower than the top surface of the STIs in the substrate 101 (101A, 101B, 101C).

Referring to FIG. 5*e*, the first conductive layer 115 (e.g., a polysilicon gate layer) is formed without patterning upon the tunnel barrier layer 105 (105*a*, 105*b*, 105*c*) in all of portions "b" and "c" of the integrated circuit, also filling in the recesses between and covering the top surface of the STIs. Within the memory cell 131 portion "a" of the memory device, the first conductive layer 115 (subsequently patterned) will constitute a charge storage layer (floating gate) formed upon the tunnel barrier layer 105.

Referring to FIG. 5*f*, the blocking insulating layer 117 is formed and patterned upon the first conductive layer 115 within all of portions "a", "b" and "c" of the memory device. The patterning of the blocking insulating layer 117 creates a plurality of through-holes 118*a* down to the top surface of the first conductive layer 115, for subsequent filling with a conductive material 119 to form a plurality of butting contacts (119*a*, see FIG. 5*g*).

Referring to FIG. 5*g*, the second conductive layer 119 is formed without patterning upon the patterned blocking insulating layer 117, filling the plurality of through-holes 118*a* down to the top surface of the first conductive layer 115 (forming a plurality of butting contacts 119*a*), within all portions "a", "b", and "c" of the memory device. Then a patterned photo resist layer 121 (121*a*, 121*b*, 121*c*) is formed as a gate mask upon the second conductive layer 119. Then the regions of the first conductive layer 119, of the blocking insulating layer 117, and of second conductive layer 115 not covered (overlapped) by the patterned photo resist layer 121 (121*a*, 121*b*, 121*c*) are etched away to form the individual gate electrodes of the transistors 130, 132, 134, 136, and 138. Floating gates are also formed from the first conductive layer 115 in storage cells 134.

Referring again to FIG. 5h, the vertical sides of patterned gate electrodes of individual transistors 130, 132, 134, 136, and 138 are covered with spacer (e.g., oxide) 126. And then N+ type impurity diffusions 128 are formed on opposite sides of transistor channels within the substrate 101. Thus transistors of the memory cell 131, the low-voltage transistors (LVT) 136 and the high-voltage transistors (HVT) 138 are completed.

As a result, the tunnel barrier layer 105, are formed upon active regions in all of portions "a", "b" and "c" of the integrated circuit. The tunnel barrier layer 105 (105a, 105b, 105c) does not cover (overlap) the STIs in any of portions "a", "b" and "c" of the integrated circuit. The tunnel barrier layer 105 constitutes the entire gate dielectric of the transistors 130 and 132 in the memory cells 131 and of the low-voltage transistors (LVT). The tunnel barrier layer 105 (105C) constitutes part of the gate dielectric (105c+103) in the high-voltage transistors (HVT).

Figure 6:
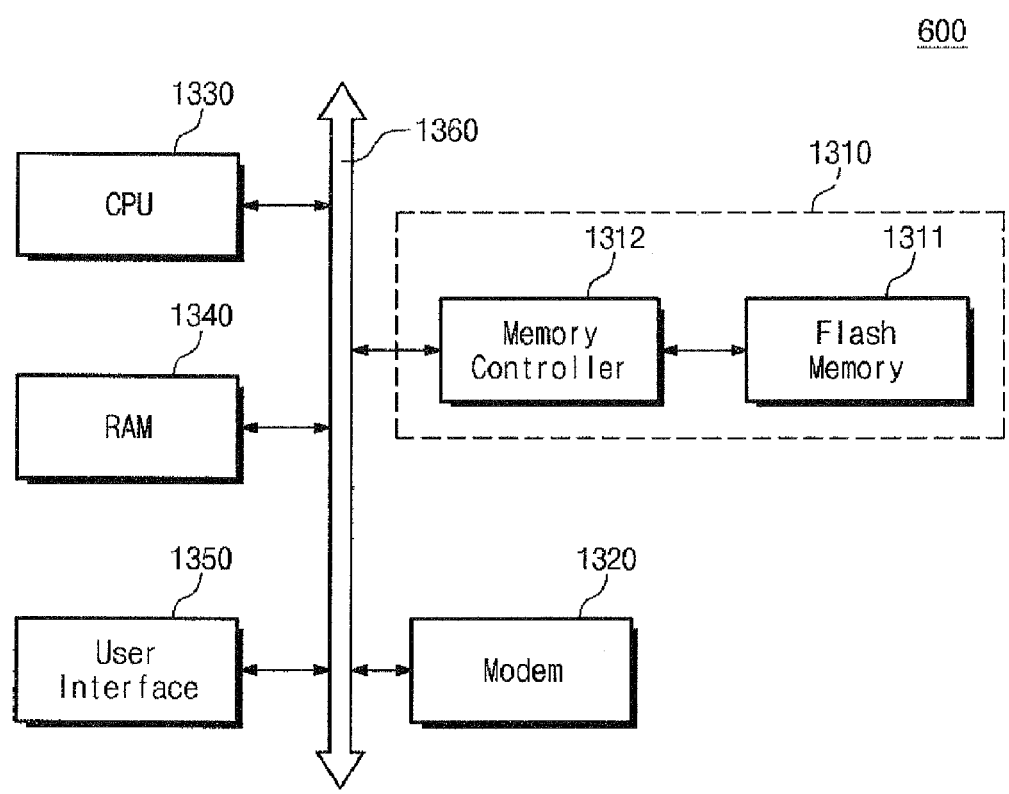
FIG. 6 is a block diagram of a computer system including a flash memory drive according to an exemplary embodiment of the present invention.

FIG. 6 is a block diagram of a computer system including a flash memory drive according to an exemplary embodiment of the present invention.

FIG. 6 is a block diagram of a computer system 600 including a memory system 1310 including a flash memory device 1311 according to an embodiment of the present invention. The memory device 1311 is coupled to a memory controller 1312 for accessing the flash memory cell array in the flash memory device 1311. The flash memory device 1311 coupled to the memory controller 1312 forms part of the computer system 600. Some examples of the computer system 600 include personal computers, peripheral devices, wireless devices, digital cameras, personal digital assistants (PDA's), MP3 audio players, MPEG video players, digital audio recorders, and digital video recorders. The memory system 1310 can be a memory card-based hard-drive, a Solid State Disk SSD (CIS), a hybrid (SSD/magnetic) disk, a Camera Image Processor (CIS) or a memory core integrated with the CPU 1330.

The memory device 1311 of the memory system 1310 of FIG. 6 receives control signals across control lines from the system bus 1360 via the memory controller 1312 to control access to the memory cell array in the memory device 1311. Access to the memory cell array in the memory device 1311 is directed to one or more target memory cells by integrated transistors in peripheral circuitry and via word lines and bit lines in the memory device 1311. Once the memory cell array is accessed in response to the control signals and the address signals, data is written to or read from the memory cells by the integrated transistors in the peripheral circuitry in the memory device 1311.

The memory device 1310 of the memory system 1310 of FIG. 6, and the memory device in the memory card 1210 of FIG. 1 can be mounted in various package types, including Ball Grid Arrays (BGAs), Chip Scale Packages (CSPs), Plastic Leaded Chip Carrier (PLCC), Plastic Dual In-Line Package (PDIP), Multi Chip Package (MCP), Wafer-level Fabricated Package (WFP), Wafer-Level Processed Stack Package (WSP).

As described above, in memory devices in accordance with exemplary embodiments of the invention, memory cells, the low voltage transistors, and high voltage transistors operating at a relatively higher voltage are integrated and formed using the same process steps, thus increasing manufacturing efficiency.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of forming an integrated circuit on a substrate, the integrated circuit having a memory cell region including a plurality of memory cell transistors each having a gate electrode, and a peripheral region including low voltage transistors (LVT) and high voltage transistors (HVT) outside of the memory cell region, the method comprising:

forming a first trench isolation (TI) within the memory cell region for isolating at least one of the memory cell transistors, and forming a second trench isolation (TI) for isolating at least one of the low voltage transistors (LVT) and forming a third trench isolation (TI) for isolating at least one of the high voltage transistors (HVT); and forming a tunnel barrier layer having first and second dielectric layers within the memory cell region between the gate electrodes of the memory cell transistors and the substrate, and within the peripheral region.

2. The method of claim 1, wherein forming the tunnel barrier layer within the peripheral region includes forming the tunnel barrier layer within the low voltage transistors (LVT) and within the high voltage transistors (HVT).

3. The method of claim 1, wherein the step of forming the tunnel barrier layer comprises the substeps of:

forming the first dielectric layer;
forming the second dielectric layer upon the first dielectric layer; and
forming a third dielectric layer upon the a second dielectric layer,
wherein the first dielectric layer is an oxide layer, the second dielectric layer is a nitride layer, and the third dielectric layer is an oxide layer.

4. The method of claim 1, wherein the first, second, and third trench isolation are formed prior to forming the tunnel barrier layer, and the tunnel barrier layer is formed upon the first trench isolation.

5. The method of claim 1, wherein the first trench isolation, the second trench isolation, and the third trench isolation are formed prior to forming the tunnel barrier layer, and the tunnel barrier layer is formed upon the second trench isolation and upon the third trench isolation.

6. The method of claim 1, wherein the first trench isolation, the second trench isolation, and the third trench isolation are formed after forming the tunnel barrier layer, and the tunnel barrier layer is not formed upon the first trench isolation, nor upon the second trench isolation nor upon the third trench isolation.

7. The method of claim 1, wherein the step of forming the first trench isolation, the second trench isolation and the third trench isolation includes the substeps of:

forming a buffer layer (109) upon the tunnel barrier layer;
forming a stopper layer upon the buffer layer;
etching the buffer layer, the stopper layer, and the substrate to form the trenches;
filling the trenches; and
removing the buffer layer and stopper layer.

8. The method of claim 1, further comprising the steps of:
forming a first conductive layer upon the tunnel barrier layer;
forming a blocking insulating layer upon the first conductive layer;

patterning the blocking insulating layer within the peripheral region to form butting contact holes;

patterning the blocking insulating layer within the memory cell region to form gate dielectrics of the memory cell transistors and butting contacts holes;

forming a second conductive layer upon the patterned blocking insulating layer and forming butting contacts connecting the first conductive layer and the second conductive layer within the gate electrodes of the LVT and HVT in the peripheral region; and patterning the second conductive layer, the blocking insulating layer, and the first conductive layer within the peripheral region.

9. A method of forming an integrated circuit on a substrate, the integrated circuit having a memory cell region including a plurality of memory cell transistors each having a gate electrode, and a peripheral region including low voltage transistors (LVT) and high voltage transistors (HVT), outside of the memory cell region, the method comprising:

forming the gate oxide layer upon the substrate within the peripheral region;

forming a first trench isolation (TI) within the memory cell region for isolating at least one of the memory cell transistors, and forming a second trench isolation (TI) for isolating at least one of the low voltage transistors (LVT) and forming a third trench isolation (TI) for isolating at least one of the high voltage transistors (HVT); and forming a tunnel barrier layer having first and second dielectric layers within the memory cell region between the gate electrodes of the memory cell transistors and the substrate, and upon the first trench isolation (TI) in the memory cell region, wherein the gate oxide layer is thicker than the tunnel barrier layer.

10. The method of claim 9, wherein the step of forming the tunnel barrier layer comprises the substeps of:

forming the first dielectric layer;

forming the second dielectric layer upon the first dielectric layer; and forming a third dielectric layer upon the a second dielectric layer, wherein the first dielectric layer is an oxide layer, the second dielectric layer is a nitride layer, and the third dielectric layer is an oxide layer.

11. The method of claim 9, further comprising the steps of:

forming a charge storage layer of the memory cell transistors upon the tunnel barrier layer of the within the memory cell region;

forming blocking insulating layer of the memory cell transistors within the memory cell region, wherein the blocking insulating layer comprises a selection from the group consisting of $SiO_2$, $SiN$, $SiON$, $HfO_2$, $ZrO$, and $Al_2O_3$;

forming a gate electrode conductive layer upon the blocking insulating layer of the memory cell transistors within the memory cell region; and patterning the blocking insulating layer, the charge storage layer and the gate electrode conductive layer of the memory cell transistors within the memory cell region.

12. The method of claim 9, further comprising the steps of:

patterning the blocking insulating layer, the charge storage layer and the gate electrode conductive layer of the memory cell transistors within the memory cell region;

forming inner spacers upon the vertical sides of the patterned blocking insulating layer, the charge storage layer and the gate electrode conductive layer of the memory cell transistors within the memory cell region;

patterning the blocking insulating layer and the charge storage layer using the inner spacers as a mask;

forming outer spacers upon the inner spacers; and doping the substrate using the outer spacers as a mask.

* * * * *